US012744081B2

(12) United States Patent
Hwang et al.

(10) Patent No.: US 12,744,081 B2
(45) Date of Patent: Sep. 22, 2026

(54) BINARY NEURAL NETWORK HARDWARE APPARATUS

(71) Applicant: ELECTRONICS AND TELECOMMUNICATIONS RESEARCH INSTITUTE, Daejeon (KR)

(72) Inventors: Sung Min Hwang, Daejeon (KR); Dong Woo Suh, Daejeon (KR); Wang Joo Lee, Daejeon (KR); Jeong Woo Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 216 days.

(21) Appl. No.: 18/443,221

(22) Filed: Feb. 15, 2024

(65) Prior Publication Data

US 2024/0282368 A1 Aug. 22, 2024

(30) Foreign Application Priority Data

Feb. 16, 2023 (KR) ........................ 10-2023-0020790
Dec. 12, 2023 (KR) ........................ 10-2023-0180044

(51) Int. Cl.
*G11C 11/54* (2006.01)
*G11C 11/56* (2006.01)

(52) U.S. Cl.
CPC .......... *G11C 11/54* (2013.01); *G11C 11/5685* (2013.01)

(58) Field of Classification Search
CPC ............................ G11C 11/54; G11C 11/5685
USPC ........................................................ 365/148
See application file for complete search history.

(56) References Cited

U.S. PATENT DOCUMENTS

| | | | |
|---|---|---|---|
| 10,332,004 B2 | 6/2019 | Kataeva et al. | |
| 11,455,539 B2 | 9/2022 | Lee et al. | |
| 11,755,897 B2 | 9/2023 | Kim et al. | |
| 2020/0160160 A1 * | 5/2020 | Kim | G06N 3/063 |
| 2021/0166110 A1 | 6/2021 | Song | |
| 2022/0335963 A1 | 10/2022 | Jang et al. | |
| 2023/0244441 A1 | 8/2023 | Kim et al. | |

FOREIGN PATENT DOCUMENTS

| | | |
|---|---|---|
| KR | 10-2018-0093245 A | 8/2018 |
| KR | 10-2018-0132503 A | 12/2018 |
| KR | 10-2020-0058196 A | 5/2020 |
| KR | 10-2022-0045357 A | 4/2022 |
| KR | 10-2022-0112280 A | 8/2022 |
| KR | 10-2023-0080303 A | 6/2023 |

OTHER PUBLICATIONS

Hyungjun Kim et al., “In-Memory Batch-Normalization for Resistive Memory based Binary Neural Network Hardware,” ASPDAC ’19: Proceedings of the 24th Asia and South Pacific Design Automation Conference, 2019.

* cited by examiner

*Primary Examiner* — Anthan Tran

(57) ABSTRACT

Disclosed is a binary neural network hardware apparatus. The binary neural network hardware apparatus includes a sense amplifier configured to compare a bit line voltage of a bit line with a predetermined reference voltage; an input unit configured to input the bit line voltage to the sense amplifier; and a threshold voltage regulator configured to be connected to an artificial intelligence binary synapse through the bit line and change the bit line voltage in multiple levels.

9 Claims, 14 Drawing Sheets

2-LEVEL SYNAPSE

MULTI-LEVEL SYNAPSE

BINARY NEURAL NETWORK HARDWARE APPARATUS

CROSS-REFERENCE TO RELATED APPLICATION

This application claims priority to and the benefit of Korean Patent Application No. 10-2023-0020790, filed on Feb. 16, 2023 and Korean Patent Application No. 10-2023-0180044, filed on Dec. 12, 2023, which are hereby incorporated by reference for all purposes as if set forth herein.

BACKGROUND

1. Field of the Invention

The present invention relates to a binary neural network hardware apparatus.

2. Discussion of Related Art

Currently, with an increase in the utilization of artificial neural networks in various industries, unprecedented performance is being achieved in image classification, natural language processing, and autonomous driving. However, as artificial neural network models become more complex, there is a significant increase in the computational resources required for learning and inference operations, including power consumption and processing chips. To address this, research on a binary neural network (BNN), which is implemented by limiting the output values of weights and activation functions to +1 or −1, is currently being actively conducted.

The BNNs have been gaining significant attention in the field of hardware-based artificial neural network research as they can significantly reduce computing resources such as power consumption and memory, even though their classification accuracy is slightly lower compared to traditional software-based artificial neural networks. To enhance the learning stability and speed of the BNNs, it is essential to apply batch normalization (BN), which statistically normalizes the data of each layer during the learning process.

The BN operates by normalizing the results of operations for each mini-batch during the learning process using the mean u and standard deviation σ, and then scaling and shifting the normalized results using scale factors, gamma γ, and beta β. This statistical control helps prevent the internal covariate shift phenomenon, where the distribution of input data for each layer is linked and distorted, resulting in the advantage of accelerated learning and improved generalization performance.

However, implementing the BN function in hardware requires highly complex circuits. In other words, since the same number of binary synapses as the number of synapse elements connected to the neurons must be added to the existing circuit to implement hardware BN, chip area and energy efficiency may be greatly reduced and a method of reading synapse output results in an increased error rate in some cases.

SUMMARY OF THE INVENTION

The present invention is directed to providing a binary neural network hardware apparatus that implements a batch normalization (BN) function by assigning multi-level weights to binary neural network neurons using a single synapse.

According to an aspect of the present invention, there is provided a binary neural network hardware apparatus including a sense amplifier configured to compare a bit line voltage of a bit line with a predetermined reference voltage; an input unit configured to input the bit line voltage to the sense amplifier; and a threshold voltage regulator configured to be connected to an artificial intelligence binary synapse through the bit line and change the bit line voltage in multiple levels.

The input unit according to the present invention may include a resistor configured to divide the bit line voltage with the combination of the artificial intelligence binary synapse and the threshold voltage regulator.

The threshold voltage regulator according to the present invention may include a multi-level synapse configured to vary conductance in multiple levels to change synthetic conductance with the artificial intelligence binary synapse.

The multi-level synapse according to the present invention may be a conductance variable element.

The multi-level synapse according to the present invention may include a substrate; a gate electrode applied to the substrate; an $Al_2O_3$ layer applied on the substrate and the gate electrode; a $TiO_2$ layer applied to the $Al_2O_3$ layer; a source electrode applied to be spaced apart from the $TiO_2$ layer and the $Al_2O_3$ layer; and a drain electrode applied to be spaced apart from the $TiO_2$ layer and the $Al_2O_3$ layer, wherein the source electrode and the drain electrode may be spaced apart from each other, and a gate voltage applied to the gate electrode may be controlled to change conductance based on electrons and holes trapped at an interface between the $TiO_2$ layer and the $Al_2O_3$ layer.

The conductance of the multi-level synapse according to the present invention may decrease when a program positive (+) pulse is applied to the gate electrode and increase when an erase (−) pulse is applied to the gate electrode.

According to another aspect of the present invention, there is provided a binary neural network hardware apparatus including a multi-level synapse configured to vary conductance in multiple levels to change synthetic conductance with the artificial intelligence binary synapse, wherein the multi-level synapse may include a substrate; a gate electrode applied to the substrate; an $Al_2O_3$ layer applied on the substrate and the gate electrode; a $TiO_2$ layer applied to the $Al_2O_3$ layer; a source electrode applied to be spaced apart from the $TiO_2$ layer and the $Al_2O_3$ layer; and a drain electrode applied to be spaced apart from the $TiO_2$ layer and the $Al_2O_3$ layer, and wherein the source electrode and the drain electrode may be spaced apart from each other, and a gate voltage applied to the gate electrode may be controlled to vary conductance in multiple levels based on electrons and holes trapped at an interface between the $TiO_2$ layer and the $Al_2O_3$ layer.

The conductance of the multi-level synapse according to the present invention may decrease when a programming (+) pulse is applied to the gate electrode and increase when an erase (−) pulse is applied to the gate electrode.

According to still another aspect of the present invention, there is provided a binary neural network hardware apparatus including a sense amplifier configured to compare a bit line voltage of a bit line with a predetermined reference voltage; a threshold voltage regulator configured to be connected to an artificial intelligence binary synapse through the bit line and change the bit line voltage in multiple levels; and an integrator configured to accumulate the synapse output current of the artificial intelligence binary synapse to detect the bit line voltage.

The integrator according to the present invention may include a capacitor configured to have one side connected to the bit line and the other side connected to ground to accumulate the output current of the bit line; and a reset switch configured to discharge the capacitor.

The threshold voltage regulator according to the present invention may include a multi-level synapse configured to vary conductance in multiple levels to change synthetic conductance with the artificial intelligence binary synapse.

The multi-level synapse according to the present invention may be a conductance variable element.

The multi-level synapse according to the present invention may include a substrate; a gate electrode applied to the substrate; an $Al_2O_3$ layer applied on the substrate and the gate electrode; a $TiO_2$ layer applied to the $Al_2O_3$ layer; a source electrode applied to be spaced apart from the $TiO_2$ layer and the $Al_2O_3$ layer; and a drain electrode applied to be spaced apart from the $TiO_2$ layer and the $Al_2O_3$ layer, wherein the source electrode and the drain electrode may be spaced apart from each other, and a gate voltage applied to the gate electrode may be controlled to change conductance based on electrons and holes trapped at an interface between the $TiO_2$ layer and the $Al_2O_3$ layer.

The conductance of the multi-level synapse according to the present invention may decrease when a programming (+) pulse is applied to the gate electrode and increase when an erase (−) pulse is applied to the gate electrode.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
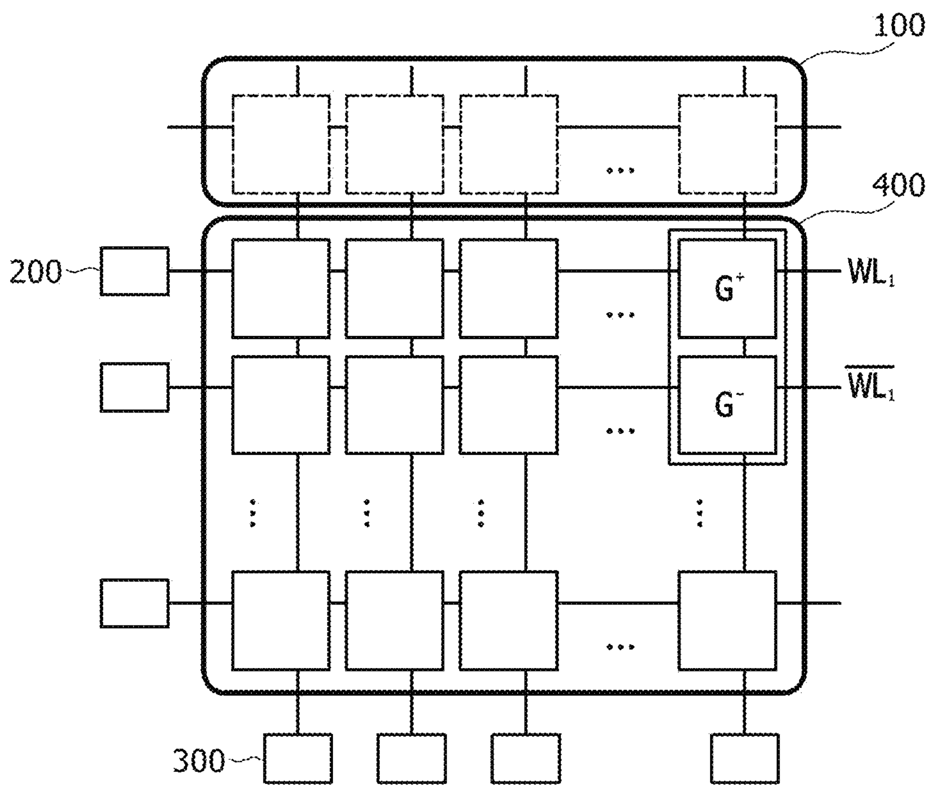
FIG. 1 is a block diagram illustrating a binary neural network hardware apparatus capable of implementing batch normalization (BN)

Hereinafter, a binary neural network hardware apparatus according to an embodiment of the present invention will be described with reference to the attached drawings. In this process, the thickness of lines or sizes of components shown in the drawing may be exaggerated for clarity and convenience of explanation. In addition, the terms described below are terms defined in consideration of functions in the present invention, and may vary depending on the intention or custom of the user or operator. Therefore, definitions of these terms should be made based on the content throughout this specification.

Figure 2:
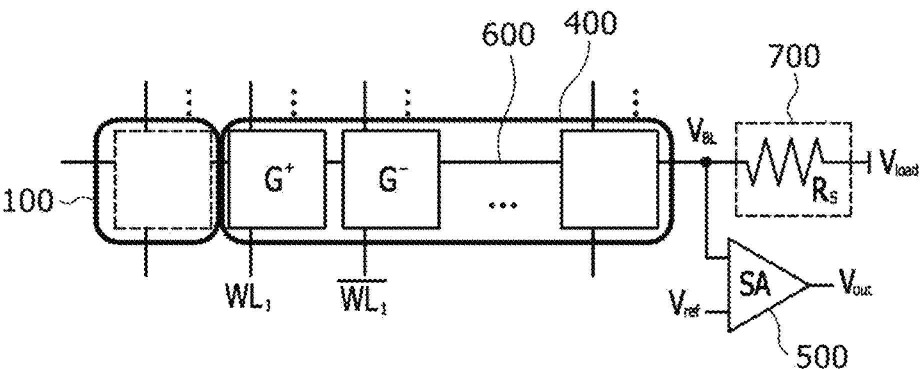
FIG. 2 is a block diagram illustrating 1-column in FIG. 1.

FIG. 1 is a block diagram illustrating a binary neural network hardware apparatus capable of implementing batch normalization (BN), and FIG. 2 is a block diagram illustrating 1-column in FIG. 1.

Referring to FIGS. 1 and 2, a binary neural network hardware apparatus according to an embodiment of the present invention may be a binary neural network inference apparatus capable of implementing BN, and may be an off-chip inference apparatus for edge devices that can achieve high performance without being connected to a server by transferring high-quality learned weights to a hardware chip.

The binary neural network hardware apparatus according to an embodiment of the present invention may include a threshold voltage regulator 100, a pre-synaptic neuron 200, a post-synaptic neuron 300, an artificial intelligence binary synapse 400, a sense amplifier 500, and an input unit 700.

When the input x, weight w, and bias b of the BNN are satisfied, the weighted-sum s input to the post-synaptic neuron may be expressed as Equation 1 below.

$$s(x) = \sum wx + b \qquad \text{[Equation 1]}$$

When BN parameters such as mean μ, standard deviation σ, scale factor γ, and β obtained through learning are applied, the output BN(x) of a BN layer operates in the manner shown in Equation 2 below.

$$BN(x) = \gamma\frac{s(x) - \mu}{\sqrt{\sigma^2 + \epsilon}} + \beta \qquad \text{[Equation 2]}$$

In a binary neural network, the output ab of the post-synaptic neuron 300 may be a value of +1 when the output BN(x) is 0 or more, and may be a value of −1 otherwise. This is shown in Equation 3 below.

$$a_b = \begin{cases} +1, & \text{if } BN(x) \geq 0 \\ -1, & \text{otherwise} \end{cases} \qquad \text{[Equation 3]}$$

When this is simplified by combining Equation 2 and Equation 3, the above-described BN parameters may be expressed as the threshold value $N_{th}$ of the post-synaptic neuron 300 as shown in Equation 4 below.

$$a_b = \begin{cases} +1, & \text{if } s(x) \geq N_{th} \\ -1, & \text{otherwise} \end{cases} \quad \text{where } N_{th} = \frac{-\beta\sqrt{\sigma^2 + \epsilon}}{\gamma} + \mu \qquad \text{[Equation 4]}$$

Accordingly, the binary neural network hardware apparatus according to the present embodiment may use a semiconductor device with multi-level conductance variable characteristics to implement an off-chip inference apparatus that operates with BN weights, thereby enabling multiple adjustments with respect to the threshold value $N_{th}$ of the post-synaptic neuron 300.

The artificial intelligence binary synapse 400 may only be utilized in a 2-level conductance state to implement a binary neural network, and when two synapse element are used as one synapse pair, both positive and negative weights can be implemented $$(w = G^{+} - G^{-}).$$

In FIG. 2, in the artificial intelligence binary synapse 400 and the threshold voltage regulator 100, various non-volatile memories such as flash memory, resistive random access memory (RRAM), magnetoresistive random access memory (MRAM), phase change random access memory (PRAM), etc., are applied.

The threshold voltage regulator 100 may be a device capable of controlling multi-level conductance.

FIG. 2 shows a single column configuration in which an artificial intelligence binary synapse 400 is connected to a sense amplifier 500 that plays the role of a post-synaptic neuron 300 in a binary neural network.

The sense amplifier 500 may compare the magnitudes of two input voltages to output the compared result as high or low.

In FIG. 2, the output of the sense amplifier 500 may be determined depending on the magnitude between a bit line voltage $V_{BL}$ and a reference voltage $V_{ref}$.

The bit line voltage $V_{BL}$ is the divided voltage between the resistor $R_S$ and the combination of the threshold voltage regulator 100 and artificial intelligence binary synapse 400.

The input unit 700 may include the resistor $R_S$ and input the bit line voltage $V_{BL}$ to the sense amplifier 500.

The resistor $R_S$ may be connected in series with the column of the artificial intelligence binary synapse 400. A node between the resistor $R_S$ and the artificial intelligence binary synapse may be connected to the input of the sense amplifier 500.

Accordingly, BN may be implemented by linking the reference voltage $V_{ref}$ of FIG. 2 to the threshold value $N_{th}$ of Equation 4.

However, since the artificial neural network has different threshold values of $N_{th}$ at each hidden layer and generating $V_{ref}$ corresponding to $N_{th}$ requires a precise digital to analog converter (DAC) circuit, chip area and power consumption increase significantly.

On the contrary, in the present embodiment, we use a fixed reference voltage $V_{ref}$ but adjust the bit line voltage $V_{BL}$ linked to $N_{th}$ using a threshold voltage regulator, a circuit much simpler than the DAC.

Figure 3:
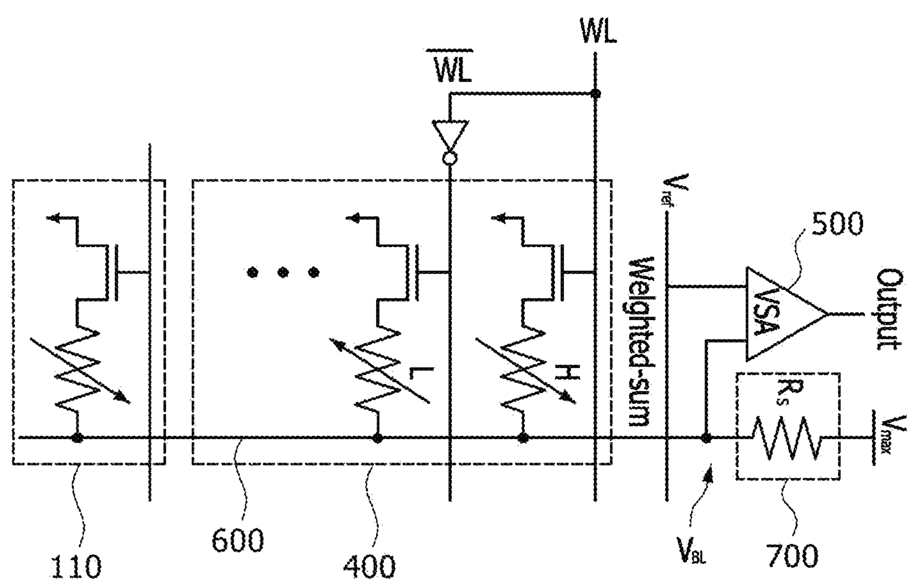
FIG. 3 illustrates a BN circuit using a threshold voltage regulator.

FIG. 3 illustrates a BN circuit using a threshold voltage regulator.

Referring to FIG. 3, in the BN circuit, at least one multi-level synapse 110 may be connected to one post-synaptic neuron 300.

The multi-level synapse 110 may adjust the threshold value $N_{th}$ as described above.

Since one multi-level synapse 110 is used to adjust the bit line voltage, the chip area and power consumption for adjusting the threshold voltage corresponding to $N_{th}$ may be significantly reduced.

Since the multi-level synapse 110 has a multi-level conductance state, the output value $V_{BL}$ may be adjusted in multiple levels for the fixed reference voltage $V_{ref}$ and the determined weight (conductance) of the artificial intelligence binary synapses.

In other words, we can implement BN according to Eq. 4 by adjusting the conductance of the threshold voltage regulator with the fixed $V_{ref}$ and the weight (conductance) of the artificial intelligence binary synapses.

In FIG. 3, the artificial neural network binary synapse may store conductance weights.

The artificial neural binary synapse 400 may include a plurality of memory elements and transistors.

The memory element may be a resistive memory element.

The transistor may connect a bit line 600 and the memory element. The drain terminal of the transistor may be connected to the memory element, the source terminal may be connected to ground, and the gate terminal may be connected to the input terminal.

Accordingly, the memory element may be connected between the drain of the transistor and the bit line 600, so that a circuit that is connected from a voltage $V_{max}$ to ground through the memory element may be formed.

Here, a signal and a complementary signal may be input as the gate signal through a word line and a word line bar.

The signals output according to the circuit of the artificial intelligence binary synapse 400 may be overlapped and output through the bit line 600.

Meanwhile, the multi-level synapse 110 may be connected to the bit line 600.

Accordingly, the bit line voltage $V_{BL}$ may be determined by the synthetic conductance of the conductance of the multi-level synapse 110 and the conductance of the artificial intelligence binary synapse 400, and the resistor $R_S$.

In this case, since the multi-level synapse 110 may have multi-level conductance states, the bit line voltage $V_{BL}$ may be adjusted by adjusting the conductance of the multi-level synapse 110.

Although the multi-level synapse 110 may have the multi-level conductance states, the multi-level synapse 110 can also be used as a 2-level binary synapse.

Elements that can be used as the multi-level synapse 110 may be conductance variable elements. The conductance variable element may be a resistive RAM (RRAM), phase change RAM (PRAM), ferroelectric RAM (FeRAM), flash memory, oxide-based device, or ion device. The type of the multi-level synapse 110 is not particularly limited.

The number of states of the multi-level synapse 110 may vary depending on the type and material of the element.

Figure 4:
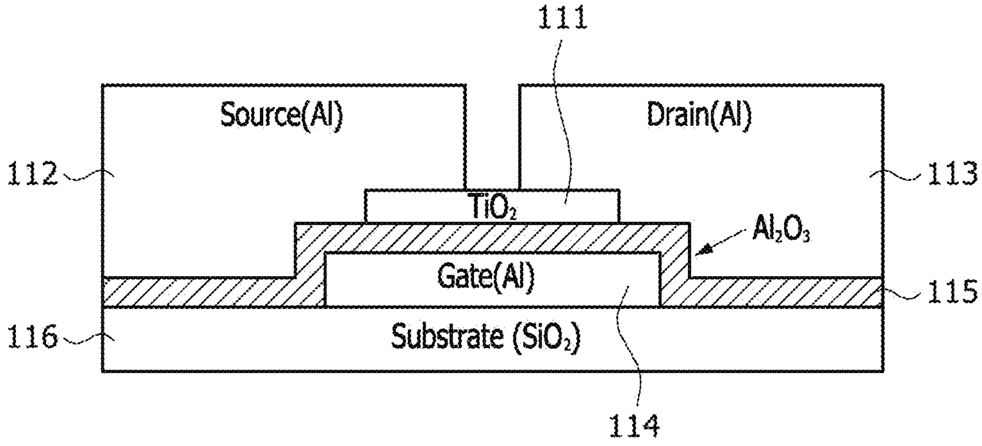
FIG. 4 is a structural diagram illustrating an oxide-based multi-level synapse.

FIG. 4 is a structural diagram illustrating an oxide-based multi-level synapse.

FIG. 4 shows an example of the multi-level synapse 110, which is the oxide-based multi-level synapse 110.

The oxide-based multi-level synapse 110 may be a three-terminal transistor structure that can be manufactured using a complementary metal-oxide semiconductor (CMOS) compatible process.

In the oxide-based multi-level synapse 110, a gate electrode 114 may be applied on a substrate 116.

An $Al_2O_3$ layer 115 may be applied on the substrate 114 and the gate electrode 116, and a $TiO_2$ layer 111 may be partially applied on the $Al_2O_3$ layer 115.

The source electrode 112 and the drain electrode 113 are applied to the $TiO_2$ layer 111 and the $Al_2O_3$ layer 115, and the source electrode 112 and the drain electrode 113 are spaced apart from each other.

In this oxide-based multi-level synapse 110, the current flowing between the source electrode 112 and the drain electrode 113 along the $TiO_2$ layer 111 may be controlled by the gate voltage. The gate voltage may have various conductance states depending on the electrons and holes trapped at the interface between $TiO_2$ 111 and $Al_2O_3$ 115.

The conductance of the multi-level synapse 110 may be adjusted by inputting a control pulse with a predetermined size or more to the gate electrode 114. That is, when a programming (+) pulse is applied to the gate electrode 114 while the source electrode 112 and the drain electrode 113 are grounded, the conductance of the multi-level synapse 110 may be reduced because the electrons are trapped in the interface between $TiO_2$ 111 and $Al_2O_3$ 115. Conversely, when an erase (−) pulse is applied to the gate electrode 114, the conductance of the multi-level synapse 110 may be increased because the electrons are emitted or the holes are trapped.

Figure 5A:
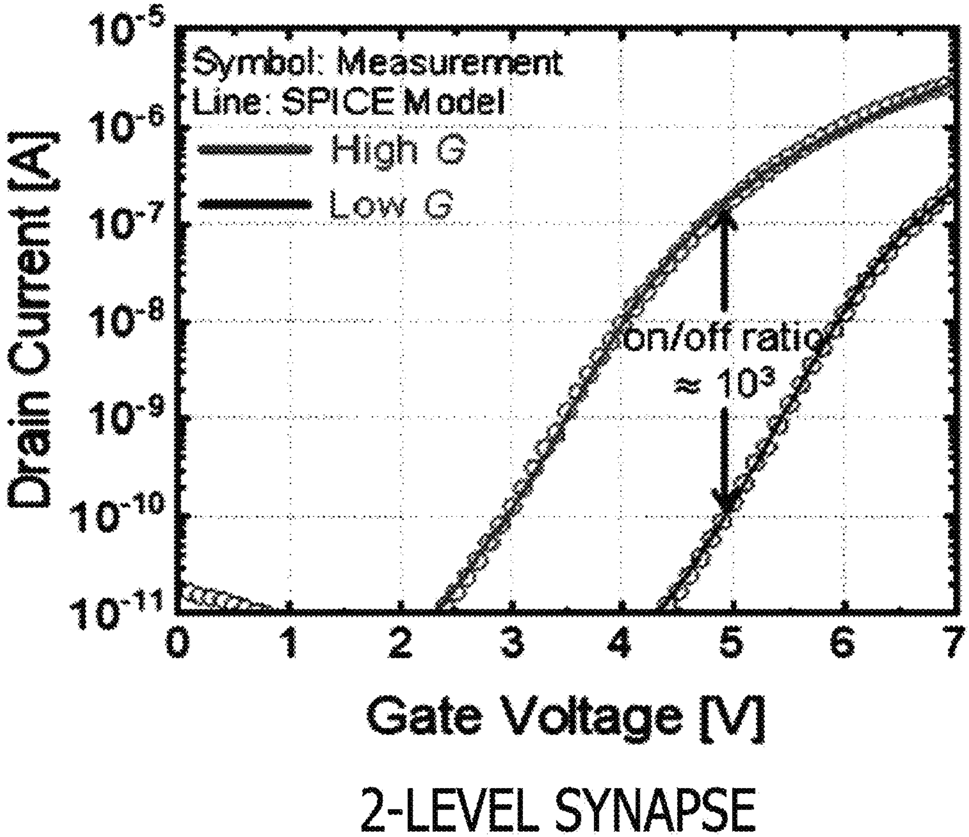
FIGS. 5A-5B are diagrams illustrating I-V curves of synapse elements according to gate read voltages.
Figure 5B:
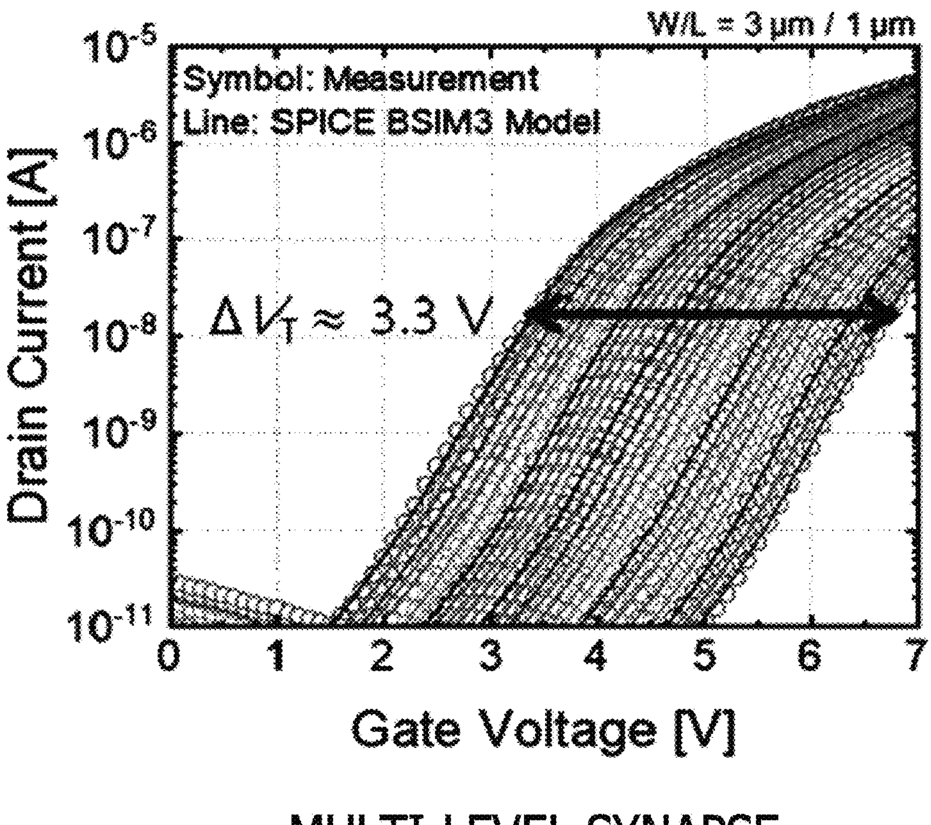

FIGS. 5A-5B are diagrams illustrating I-V curves of synapse elements according to gate voltages.

FIGS. 5A-5B show examples of an I-V curve obtained by measuring the synaptic current while applying 1V between the source and drain and applying a voltage between 0V to 7V to the gate.

A two-level synapse shown in FIG. 5A allows two current values for the gate voltage. This indicates that the number of conductance states of the 2-level synapse is two.

On the other hand, the multi-level synapse 110 shown in FIG. 5B shows 27 current values with respect to the gate voltage. This indicates that the number of conductance states of the multi-level synapse 110 is 27.

Through this, it can be seen that the number of conductance states of the multi-level synapse 110 is greater than the number of 2-level conductance states.

Figure 6:
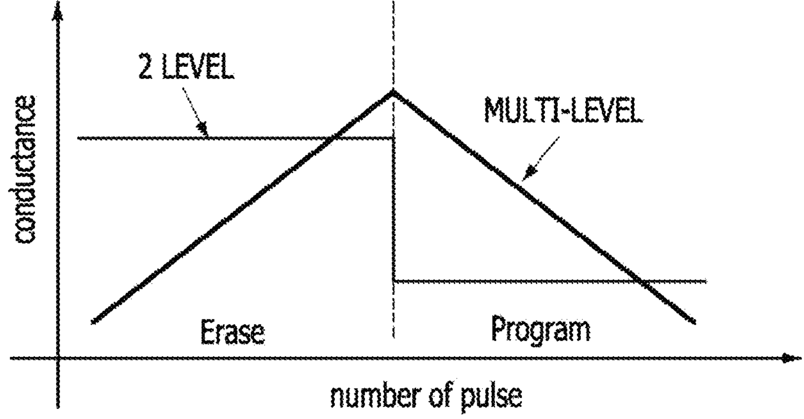
FIG. 6 is a diagram illustrating a change in the conductance of a multi-level synapse element due to programming pulse application.

FIG. 6 is a diagram illustrating a change in the conductance of a multi-level synapse element due to pulse application.

Referring to FIG. 6, the x-axis indicates the number of pulses applied to the synapse element to change conductance, and the y-axis indicates conductance.

The conductance is obtained by fixing the gate voltage to, for example, 5V and measuring the current.

In this case, the 2-level synapse only shows a high or low state. On the other hand, it can be seen that the multi-level synapse 110 shows a multi-level pattern in which the conductance increases and decreases in proportion to the number of erase pulses and program pulses.

Since (N+1) states can be implemented using N 2-level synapses, the multi-level synapse 110 for equivalent performance in terms of threshold voltage control needs to implement (N+1) conductance states. Examples of artificial intelligence networks that are commonly used to estimate the number of conductance states required for actual artificial intelligence network calculations are as follows.

Figure 7:
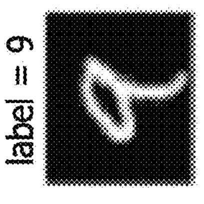
FIG. 7 is a diagram illustrating a portion of a dataset for testing MNIST artificial intelligence image classification.
Figure 7:
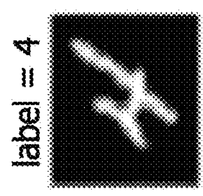
Figure 7:
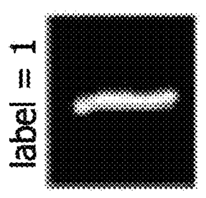
Figure 7:
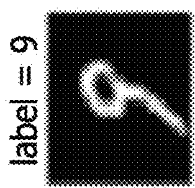
Figure 7:
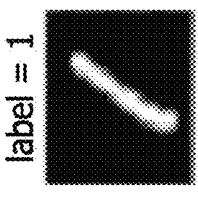
Figure 7:
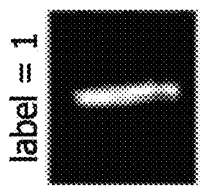
Figure 7:
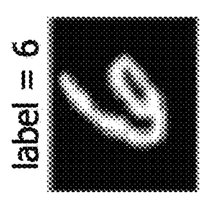
Figure 7:
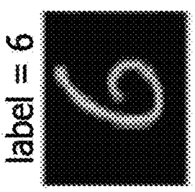
Figure 7:
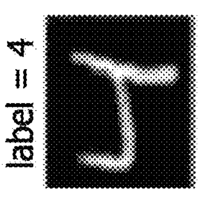
Figure 7:
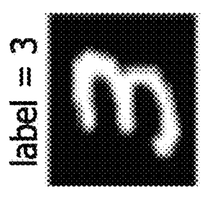
Figure 7:
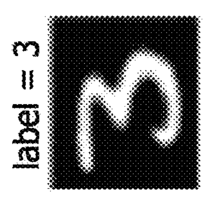
Figure 7:
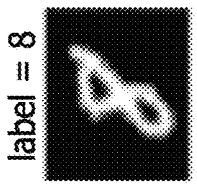
Figure 7:
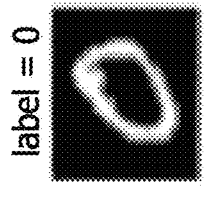
Figure 7:
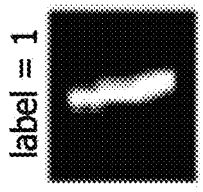
Figure 7:
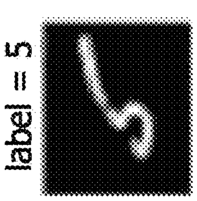
Figure 7:
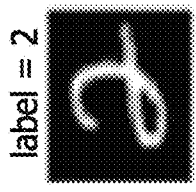
Figure 7:
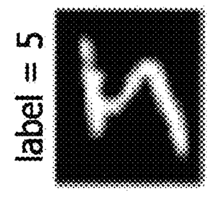
Figure 7:
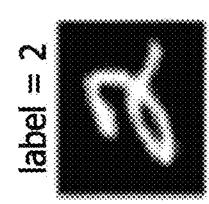
Figure 7:
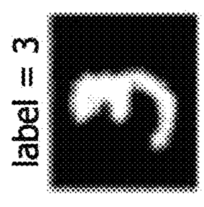
Figure 7:
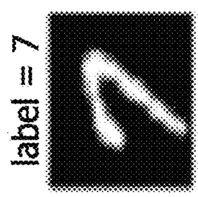

FIG. 7 is a diagram illustrating a portion of a dataset for testing MNIST artificial intelligence image classification.

FIG. 7 illustrates a portion of a modified national institute of standards and technology database (MINST) dataset used for testing artificial intelligence image classification.

Each data is a 784 (=28×28) pixel image. To classify the pixel image with a binary neural network, the number of artificial intelligence binary synapses required at each bit line at the input front layer are 784 (N), the multi-level synapse 110 should provide 785 (N+1) conductance states.

FIGS. 8A-8D are diagrams illustrating examples of comparisons of the number of conductance states of a multi-level synapse based on control pulse application.

Figure 8A:
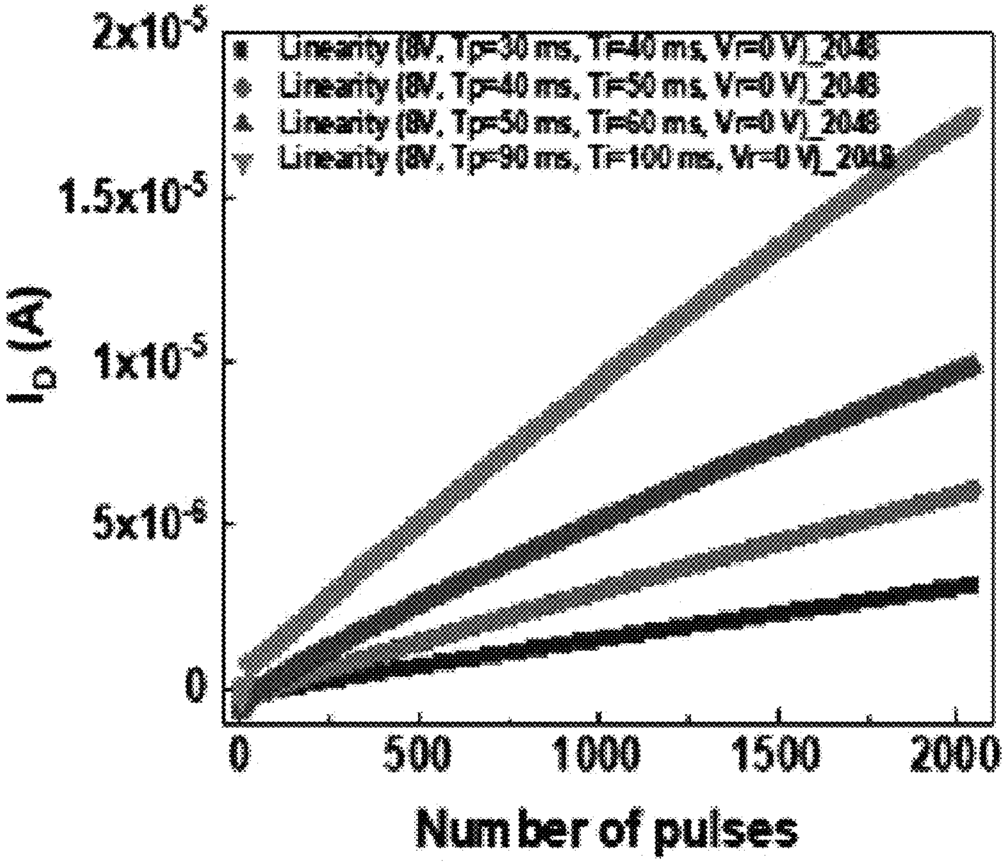
FIGS. 8A-8D are diagrams illustrating examples of comparisons of the number of conductance states of a multi-level synapse based on control pulse application.
Figure 8B:
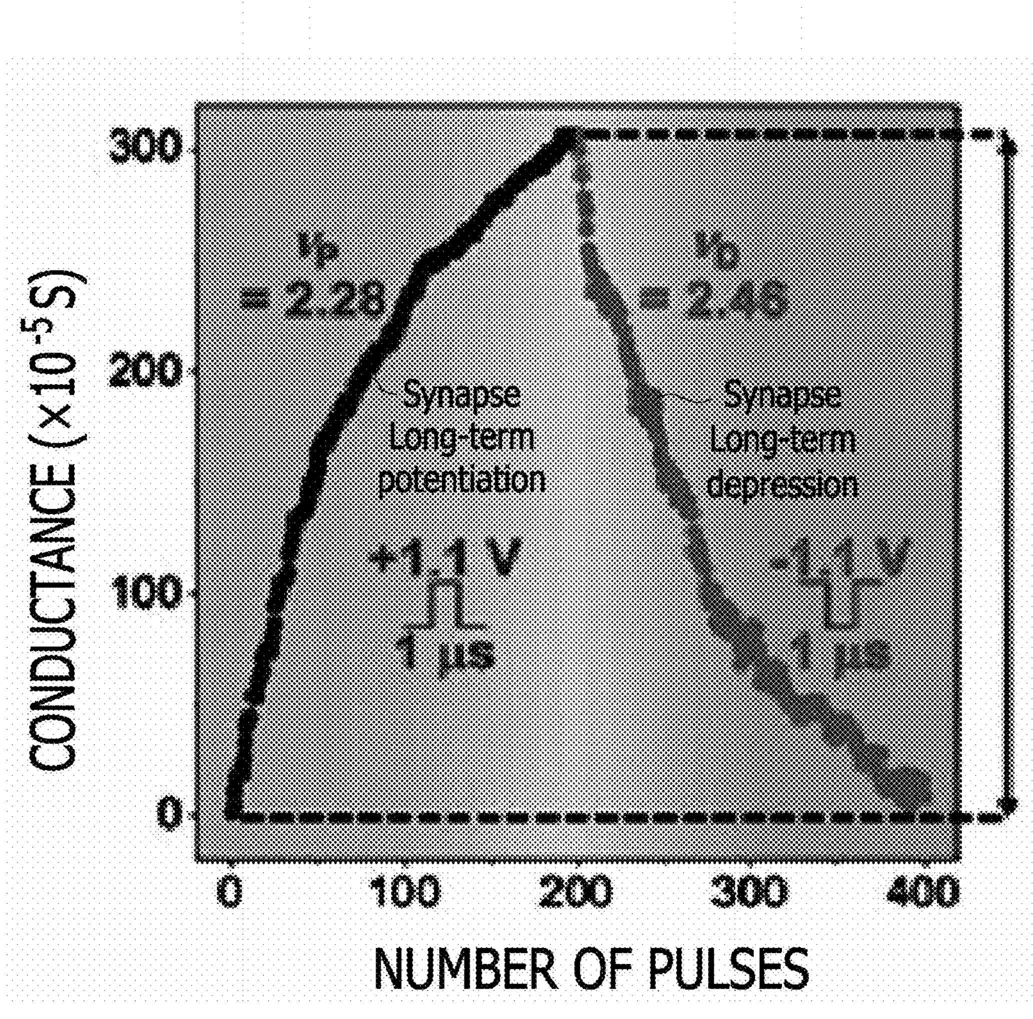
Figure 8C:
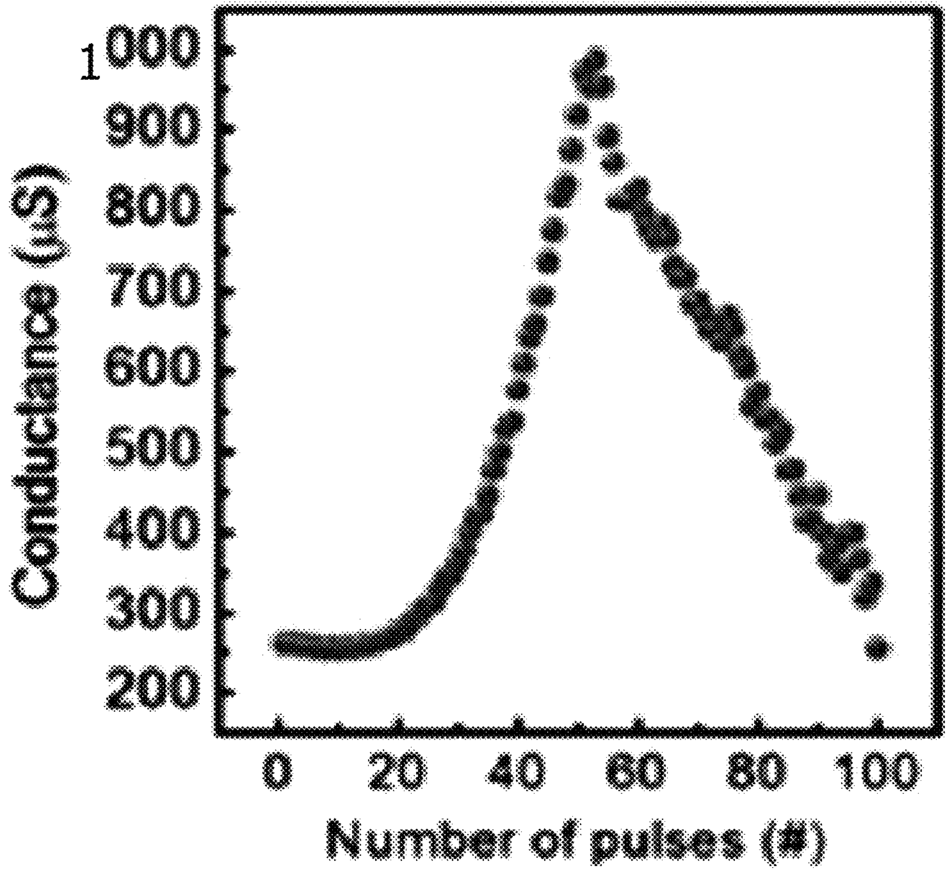
Figure 8D:
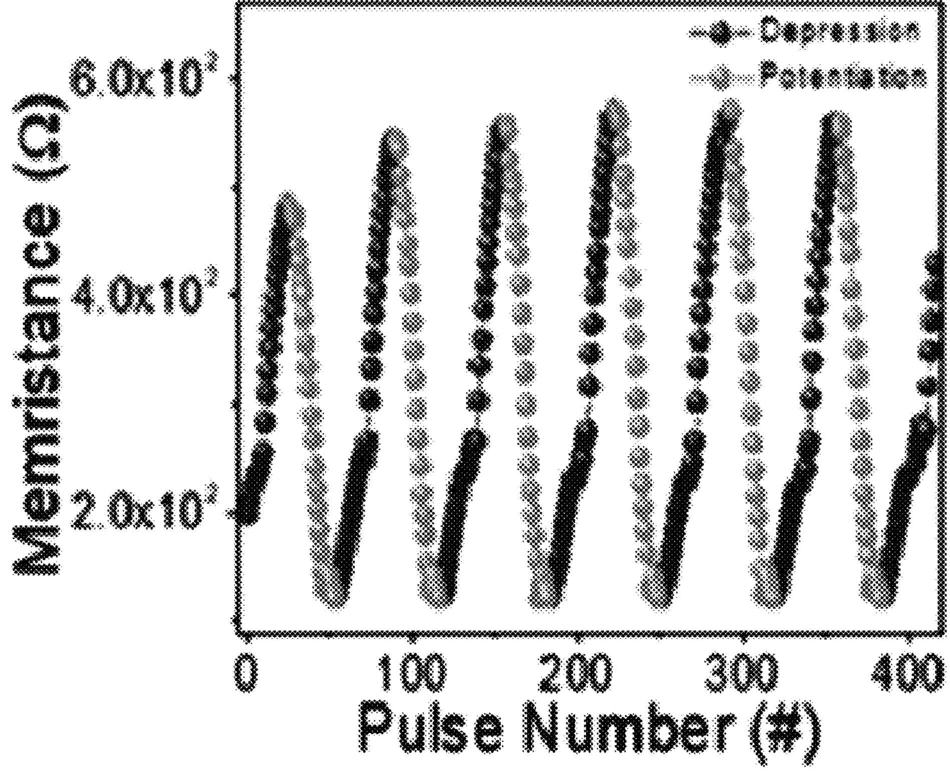

Referring to FIGS. 8A-8D, it can be seen that the number of conductance states in FIG. 8A in this embodiment is about 2000, which is significantly increased compared to the number of conductance states in FIGS. 8B, 8C, and 8D in the existing method. Based on this, the performance of the binary neural network hardware apparatus can be greatly improved.

In another embodiment, an integrator 800 may be used to detect the bit line voltage $V_{BL}$.

Figure 9:
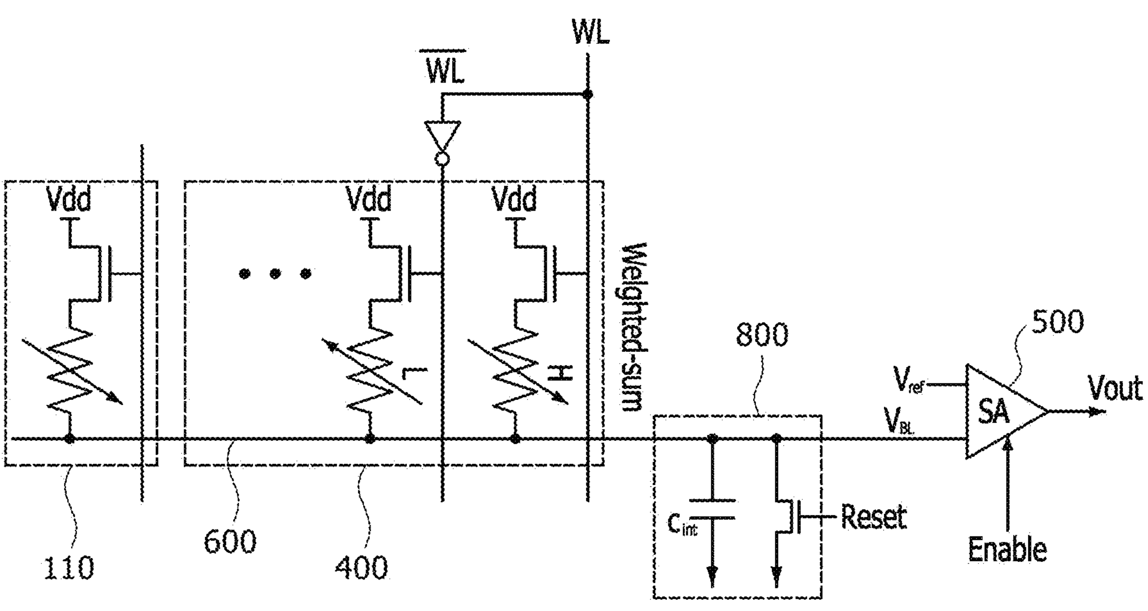
FIG. 9 illustrates a BN circuit that integrates synapse output current and inputs the integrated output to a sense amplifier.
Figure 10:
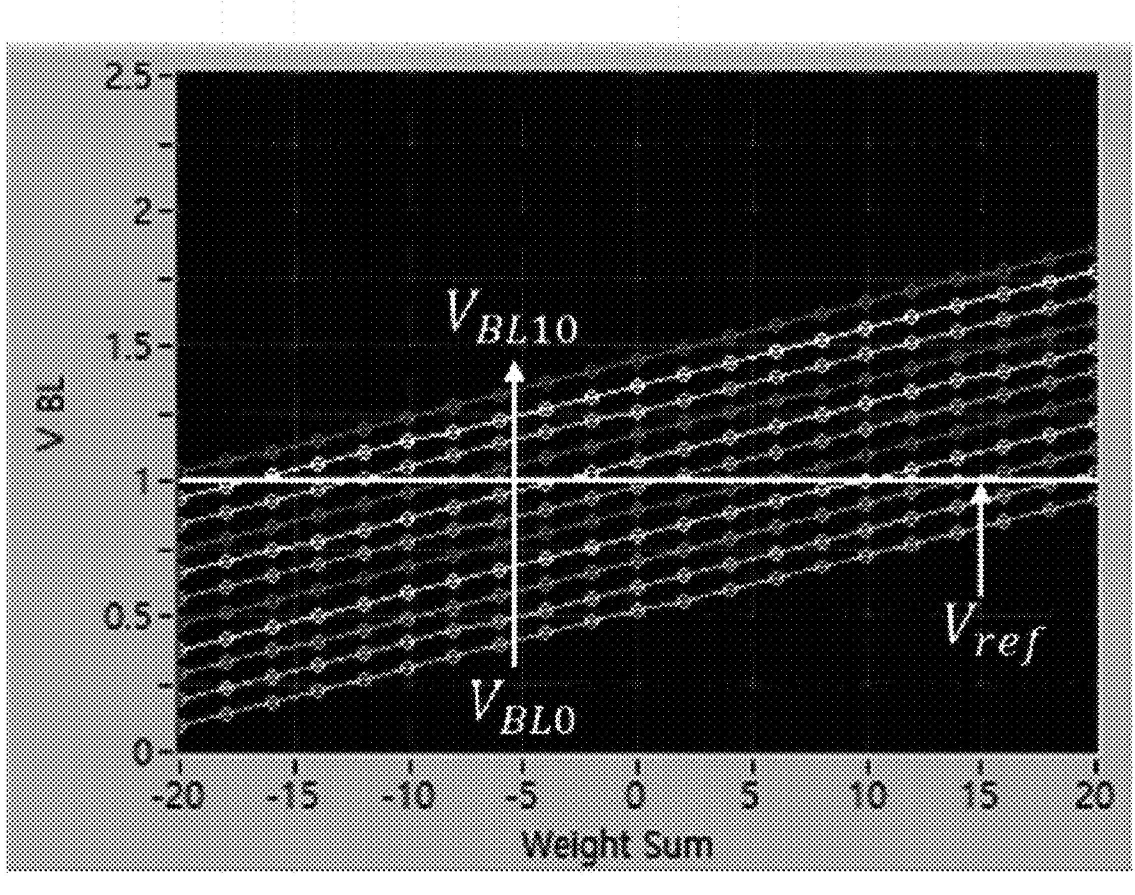
FIG. 10 is a diagram illustrating a $V_{BL}$ curve change according to a binary synapse weight sum and the several adjusted conductance states of a threshold voltage regulator immediately after Δt has elapsed after reset when an integrator is used.

FIG. 9 illustrates a BN circuit that integrates synapse output current and inputs the integrated voltage to a sense amplifier, and FIG. 10 is a diagram illustrating a $V_{BL}$ curve change according to a binary synapse weighted-sum and several adjusted conductance states of a threshold voltage regulator immediately after Δt has elapsed after reset when an integrator is used.

Referring to FIG. 9, the integrator 800 may be installed on the bit line 600 to detect the output of the threshold voltage regulator synapse 110 and the artificial intelligence binary synapse 400.

In an embodiment using the integrator 800, the multi-level synapse 110 and the artificial intelligence binary synapse 400 may be connected between the bit line 600 and a power supply voltage line that applies a power supply voltage $V_{dd}$.

The artificial intelligence binary synapse 400 may include a transistor and a memory element.

The memory element may be connected between the drain of the transistor and the bit line 600.

The drain of the transistor in the artificial intelligence binary synapse 400 may be connected to the memory element, the source may be connected to the power voltage line, and the gate may be connected to an input terminal.

Accordingly, the memory element may be connected between the drain of the transistor and the bit line 600, and may be connected to the bit line 600 according to the gate signal of the transistor.

The integrator 800 may determine the bit line voltage $V_{BL}$ by accumulating the output current of the artificial intelligence binary synapse 400 and the threshold voltage regulator synapse 110 in an internal capacitor $C_{int}$ for a certain period of time.

The integrator 800 may include a capacitor $C_{int}$ and a reset switch $S_R$.

The capacitor $C_{int}$ may be connected at one side thereof to the bit line 600 and at the other side thereof to a ground to accumulate the synapse output current. As the synapse output current is accumulated in the capacitor $C_{int}$, the bit line voltage $V_{BL}$ may rise.

The reset switch $S_R$ may reset the integrator 800. When the integrator is reset by the reset switch $S_R$, the capacitor $C_{int}$ is fully discharged, and the bit line voltage $V_{BL}$ becomes 0V.

The operation process of the integrator 800 is as follows.

First, the capacitor $C_{int}$ to which a reset pulse is input to the reset switch $S_R$ is fully discharged, and the bit line voltage $V_{BL}$ becomes 0V.

After the reset is completed, when gate signal WL, $\overline{WL}$ is input, the synapse output current is accumulated in the capacitor $C_{int}$ and the bit line voltage $V_{BL}$ rises. At this time, the larger the synapse weighted-sum, the larger the output current. The size of the bit line voltage $V_{BL}$ is proportional to the weighted-sum.

As the conductance of the threshold voltage regulator 100 is gradually increased from the minimum state, a bit line voltage curve according to the weighted-sum of the binary synapse rises upward as shown in FIG. 10, and a threshold voltage $N_{th}$, which is an intersection point of a bit line voltage curve and a reference voltage curve, moves from right to left.

In the integrator 800, the bit line voltage curve changes over time in addition to the current input to the capacitor $C_{int}$, so that the time for reading the bit line voltage $V_{BL}$ must be fixed to one.

To this end, the time Δt for reading the bit line voltage $V_{BL}$ after reset may be determined so that the intersection point between the $V_{BL}$ and $V_{ref}$ in FIG. 10 can move entirely between the maximum weight sum and minimum weight sum values by controlling the conductance of the multi-level synapse 110.

BN is implemented as the sense amplifier 500 is enabled after the time Δt has elapsed after reset and the sense amplifier 500 outputs the output voltage $V_{out}$.

As shown in FIG. 10, because the integrator 800 keeps the slope of the $V_{BL}$ curve the same when moving the bit line voltage curve by adjusting the conductance of the threshold voltage regulator, unlike a voltage division method in FIG. 3 where the slope decreases, the error occurrence rate due to noise does not increase.

As described above, the binary neural network hardware apparatus according to the present invention can implement a BN function by assigning multi-level weights to binary neural network neurons using a single synapse, and can improve energy efficiency while reducing the chip area.

The binary neural network hardware apparatus according to the present invention can maintain a constant error rate to provide ultra-small, ultra-low-power, high-performance hardware-based binary neural network services.

While various embodiments have been described above, it will be understood by those skilled in the art that the embodiments described are by way of example only. It will be apparent to those skilled in the art that various modifications and other equivalent embodiments may be made without departing from the spirit and scope of the disclosure. Accordingly, the true technical protection scope of the disclosure should be defined by the appended claims.

What is claimed is:

1. A binary neural network hardware apparatus comprising:

a sense amplifier configured to compare a bit line voltage of a bit line with a predetermined reference voltage;

an input unit configured to input the bit line voltage to the sense amplifier; and a threshold voltage regulator configured to be connected to an artificial intelligence binary synapse through the bit line and change the bit line voltage in multiple levels, wherein the threshold voltage regulator includes a multi-level synapse configured to vary conductance in multiple levels to change synthetic conductance with the artificial intelligence binary synapse.

2. The binary neural network hardware apparatus of claim 1, wherein the input unit includes a resistor configured to input the bit line voltage to the sense amplifier, and wherein the bit line voltage is a divided voltage between the resistor and the combination of the artificial intelligence binary synapse and the threshold voltage regulator.

3. The binary neural network hardware apparatus of claim 1, wherein the multi-level synapse is a conductance variable element.

4. The binary neural network hardware apparatus of claim 1, wherein the multi-level synapse includes a substrate;

a gate electrode applied to the substrate;

an $Al_2O_3$ layer applied on the substrate and the gate electrode;

a $TiO_2$ layer applied to the $Al_2O_3$ layer;

a source electrode applied to be spaced apart from the $TiO_2$ layer and the $Al_2O_3$ layer; and a drain electrode applied to be spaced apart from the $TiO_2$ layer and the $Al_2O_3$ layer, wherein the source electrode and the drain electrode are spaced apart from each other, and a gate voltage applied to the gate electrode is controlled to change conductance based on electrons and holes trapped at an interface between the $TiO_2$ layer and the $Al_2O_3$ layer.

5. The binary neural network hardware apparatus of claim 4, wherein the conductance of the multi-level synapse decreases when a program positive (+) pulse is applied to the gate electrode, and increases when an erase (−) pulse is applied to the gate electrode.

6. The binary neural network hardware apparatus of claim 1 further comprising:

an integrator configured to accumulate the synapse output current of the artificial intelligence binary synapse to detect the bit line voltage.

7. The binary neural network hardware apparatus of claim 6, wherein the integrator includes a capacitor configured to have one side connected to the bit line and the other side connected to ground to accumulate the synapse output current of the artificial intelligence binary synapse; and a reset switch configured to discharge the capacitor.

8. A binary neural network hardware apparatus comprising:

a multi-level synapse configured to vary conductance in multiple levels to change synthetic conductance with the artificial intelligence binary synapse, wherein the multi-level synapse includes a substrate;

a gate electrode applied to the substrate;

an $Al_2O_3$ layer applied on the substrate and the gate electrode;

a $TiO_2$ layer applied to the $Al_2O_3$ layer;

a source electrode applied to be spaced apart from the $TiO_2$ layer and the $Al_2O_3$ layer; and a drain electrode applied to be spaced apart from the $TiO_2$ layer and the $Al_2O_3$ layer, and wherein the source electrode and the drain electrode are spaced apart from each other, and a gate voltage applied to the gate electrode is controlled to vary conductance in multiple levels based on electrons and holes trapped at an interface between the $TiO_2$ layer and the $Al_2O_3$ layer.

9. The binary neural network hardware apparatus of claim 8, wherein the conductance of the multi-level synapse decreases when a programming (+) pulse is applied to the gate electrode, and increases when an erase (−) pulse is applied to the gate electrode.

* * * * *